(12) United States Patent
Veggetti et al.

(10) Patent No.: US 10,644,700 B2
(45) Date of Patent: May 5, 2020

(54) SOFT ERROR-RESILIENT LATCH

(71) Applicants: STMicroelectronics International N.V., Schiphol (NL); STMicroelectronics S.r.l., Agrate Brianza (IT)

(72) Inventors: Andrea Mario Veggetti, Agrate Brianza (IT); Abhishek Jain, Noida (IN)

(73) Assignees: STMICROELECTRONICS INTERNATIONAL N.V., Schiphol (NL); STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/452,051

(22) Filed: Jun. 25, 2019

(65) Prior Publication Data
US 2020/0007129 A1    Jan. 2, 2020

Related U.S. Application Data

(60) Provisional application No. 62/690,832, filed on Jun. 27, 2018.

(51) Int. Cl.
| | | |
|---|---|---|
| H03K 19/003 | (2006.01) |
| H03K 3/037 | (2006.01) |
| G11C 7/10 | (2006.01) |
| G01R 31/3181 | (2006.01) |
| H03K 3/356 | (2006.01) |

(52) U.S. Cl.
CPC . *H03K 19/00338* (2013.01); *G01R 31/31816* (2013.01); *G11C 7/106* (2013.01); *G11C 7/1087* (2013.01); *H03K 3/0375* (2013.01); *H03K 3/356121* (2013.01)

(58) Field of Classification Search
CPC .......... H03K 19/00338; H03K 3/0375; H03K 3/356121; G11C 7/1087; G11C 7/106; G01R 31/31816
See application file for complete search history.

(56) References Cited

U.S. PATENT DOCUMENTS

| | | | |
|---|---|---|---|
| 8,418,100 B2 | 4/2013 | Wang et al. | |
| 9,344,067 B1 * | 5/2016 | Wu | ...................... H01L 27/0207 |
| 9,768,757 B1 * | 9/2017 | Gaspard | ............... H03K 3/0375 |
| 10,014,048 B2 | 7/2018 | Ko | |
| 2016/0260474 A1 * | 9/2016 | Liu | ......................... G11C 11/34 |

* cited by examiner

*Primary Examiner* — Daniel D Chang
(74) *Attorney, Agent, or Firm* — Seed IP Law Group LLP

(57) ABSTRACT

A latch is provided. The latch includes a plurality of storage nodes including a plurality of data storage nodes configured to store a data bit having one of two states and a plurality of complementary data storage nodes configured to store a complement of the data bit. The latch includes a plurality of supply voltage multi-dependency stages respectively corresponding to the plurality of storage nodes. Each supply voltage multi-dependency stage has an output coupled to a storage node and at least two control inputs respectively coupled to at least two other storage nodes of the plurality of storage nodes. The supply voltage multi-dependency stage is configured to cause a state of the data bit stored in the storage node to change from a first state to a second state in response a change in both states of two data bits respectively stored in the at least two other storage nodes.

24 Claims, 4 Drawing Sheets

SOFT ERROR-RESILIENT LATCH

BACKGROUND

Technical Field

The present disclosure is directed to a data storage latch and, in particular, a data storage latch that has resiliency to soft errors that occur in stored data.

Description of the Related Art

Storage devices, such as latches, in certain scenarios experience errors that cause one or more stored data bits to change states. For example, as a result of the error, a stored data bit may change states from a logical zero to a logical one, and vice-versa. The storage errors may occur due to radiation or a particle strike, among other causes. After the error occurs, it propagates in a circuit or a system, and causes the circuit or system to malfunction or operate differently than its intended purpose.

In many applications and particularly critical applications, such as space, automotive or medical applications, among others, the tolerance for errors is low. That is due to the fact that the propagation of errors can have severe and adverse consequences.

BRIEF SUMMARY

A latch is provided. The latch is soft error-resilient, and as such can tolerate an error in one stored bit without adversely impacting the operation of the latch. The latch can recover from a one-bit error by employing redundancy and dependency.

As described herein, for each data bit, the latch stores a plurality of data bits in a respective plurality of storage nodes. Some of the storage nodes store duplicate copies of the data bit and other storage nodes store a complement of the data bit. The stored data bit may be a logical zero or a logical one. For example, if the stored data bit is a logical zero, then some of the storage nodes of the latch store the logical zero and other storage nodes of the latch store a logical one (the complement of the logical zero).

For each storage node, the latch includes one or more multi-dependency stages. A multi-dependency stage links the storage node to two or more other storage nodes of the latch. The multi-dependency stage makes the state of the data bit stored in the storage node dependent on the two or more other storage nodes on which it depends. The data in the storage node does change unless the data in the two or more other storage nodes change as well. If the data in only one of the other storage nodes changes, the change is not sufficient to trigger a change in the data of the storage node.

A change in the data of the storage node occurs when the data in all of the two or more other storage nodes (on which the storage node depends) change. If less than all the other storage nodes change states, the change is not sufficient to trigger a data change. Thus, the latch is resilient to soft errors.

DETAILED DESCRIPTION

Figure 1:
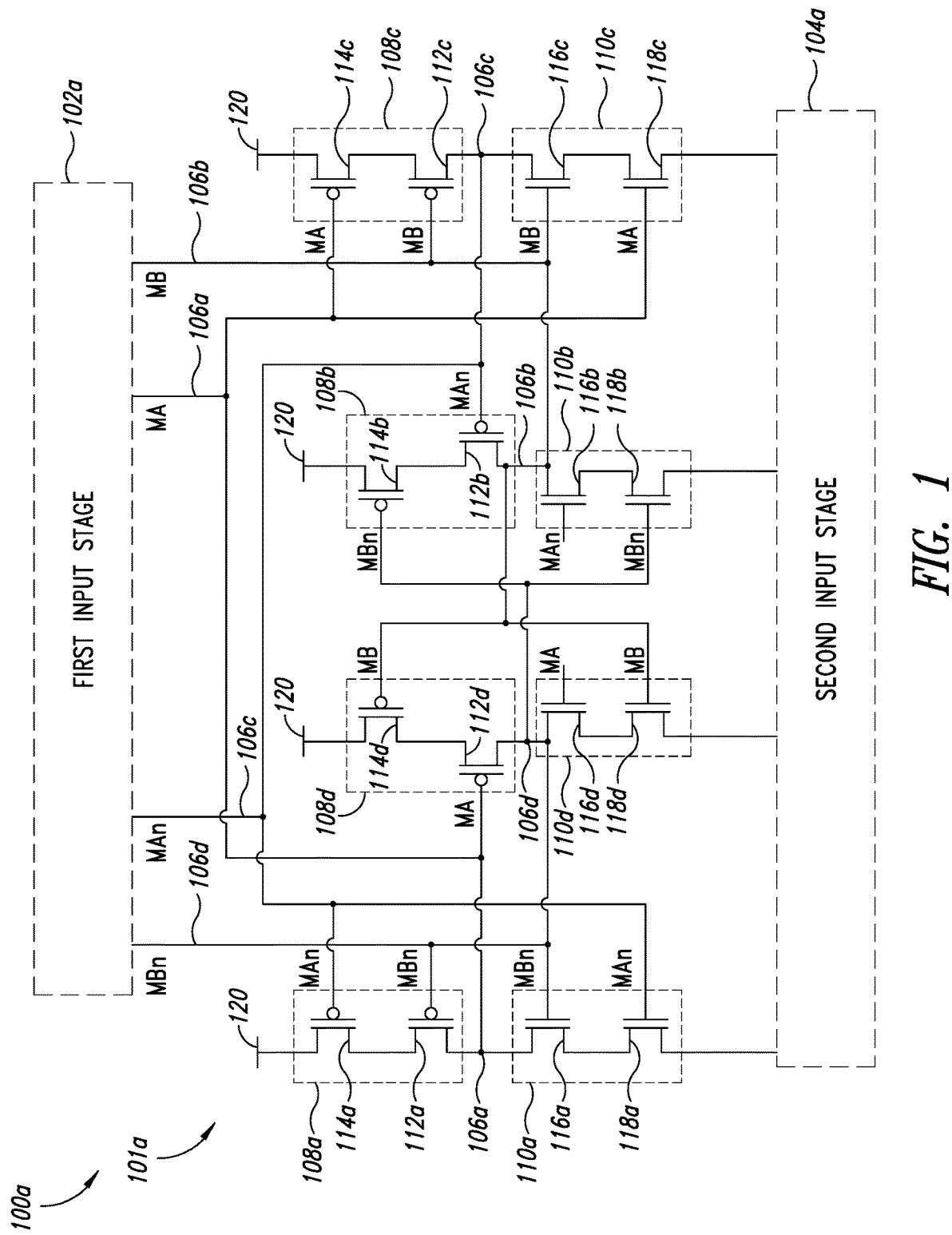
FIG. 1 shows a schematic of a latch.

FIG. 1 shows a schematic of a latch 100a. The latch 100a includes a memory stage 101a coupled to first and second input stages 102a, 104a. The latch 100a is a memory device that stores one or more bits of data. The latch 100a includes four data storage nodes; a first data storage node 106a, a second data storage node 106b, a first complementary data storage node 106c and a second complementary data storage node 106d. The data storage nodes 106a-d are coupled to the first input stage 102a. In the latch 100a, each data storage node 106a-d is coupled to an associated supply voltage multi-dependency stage 108a-d and an associated reference voltage multi-dependency stage 110a-d. In particular, the latch 100a includes first and second supply voltage multi-dependency stages 108a, 108b for the first and second data storage nodes 106a, 106b, respectively. The latch 100a includes third and fourth supply voltage multi-dependency stages 108c, 108d for the first and second complementary data storage nodes 106c, 106d, respectively. The latch 100a also includes first and second reference voltage multi-dependency stages 110a, 110b for the first and second data storage nodes 106a, 106b, respectively, and third and fourth reference voltage multi-dependency stages 110c, 110d for the third and fourth complementary data storage nodes 106c, 106d, respectively.

The supply voltage multi-dependency stages 108a, 108b, 108c, 108d respectively selectively couple the data storage nodes 106a, 106b, 106c, 106d to a voltage source node 120. The voltage source node 120 may supply a supply voltage (or a rail voltage ($V_{dd}$), among others), to the latch 100a. The supply voltage may be a voltage level representative of a logical one. The reference voltage multi-dependency stages 110a, 110b, 110c, 110d respectively selectively couple the data storage nodes 106a, 106b, 106c, 106d to the second input stage 104a. The second input stage 104a selectively couples the reference voltage multi-dependency stages 110a-d to a reference voltage node (not shown) for providing a reference voltage (or a ground voltage) for selectively grounding the data storage nodes 106a-d. The reference voltage may be a zero voltage having a voltage level representative of a logical zero.

Each supply voltage multi-dependency stage 108a-d includes two cascaded transistors. The first, second, third and fourth supply voltage multi-dependency stages 108a, 108b, 108c, 108d include a first transistor 112a, 112b, 112c, 112d and a second transistor 114a, 114b, 114c, 114d, respectively. The first, second, third and fourth reference voltage multi-dependency stages 110a, 110b, 110c, 110d include a first transistor 116a, 116b, 116c, 116d and a second transistor 118a, 118b, 118c, 118d, respectively.

In each supply voltage multi-dependency stage 108a-d, the first transistor 112a-d has a drain coupled to the stage's 108a-d data storage node 106a-d and a source coupled to the drain of the second transistor 114a-d. The first transistor 112a-d has a gate coupled to another data storage node 106a-d. The second transistor 114a-d has a source coupled to the voltage source node 120 and a gate coupled to another data storage node 106a-d different than the data storage node 106a-d to which the gate of the first transistor 112a-d is coupled.

Although the first and second transistors 112a-d, 114a-d of the supply voltage multi-dependency stage 108a-d are shown to be p-channel metal-oxide-semiconductor field-effect transistors (MOSFETs), any other type of transistor may be used. Each supply voltage multi-dependency stage 108a-d may have a data input at the source of the second transistor 114a-d, first and second control inputs at the gates of the first and second transistors 112a-d, 114a-d, respectively, and an output at the drain of the first transistor 112a-d. Thus, the supply voltage multi-dependency stage 108a-d provides an output voltage at the data storage node 106a-d (output of the stage 108a-d) that is dependent on the voltages of gates of the first and second transistors 112a-d, 114a-d (control inputs of the stage 108a-d) and the source voltage at the voltage source node 120 (input of the stage 108a-d).

In the first supply voltage multi-dependency stage 108a, the drain of the first transistor 112a is coupled to the first data storage node 106a, the gate of the first transistor 112a is coupled to the second complementary data storage node 106d, and the gate of the second transistor 114a is coupled to the first complementary data storage node 106c. In the second supply voltage multi-dependency stage 108b, the drain of the first transistor 112b is coupled to the second data storage node 106b, the gate of the first transistor 112b is coupled to the first complementary data storage node 106c, and the gate of the second transistor 114b is coupled to the second complementary data storage node 106d. In the third supply voltage multi-dependency stage 108c, the drain of the first transistor 112c is coupled to the first complementary data storage node 106c, the gate of the first transistor 112c is coupled to the second data storage node 106b, and the gate of the second transistor 114c is coupled to the first data storage node 106a. In the fourth supply voltage multi-dependency stage 108d, the drain of the first transistor 112d is coupled to the second complementary data storage node 106d, the gate of the first transistor 112d is coupled to the first data storage node 106a, and the gate of the second transistor 114d is coupled to the second data storage node 106b.

The reference voltage multi-dependency stages 110a-d of the plurality of data storage nodes 106a-d and are similarly configured as the respective supply voltage multi-dependency stages 108a-d with a difference being that the input of the reference voltage multi-dependency stages 110a-d is coupled to the second input stage 104a rather than the voltage source node 120.

Each reference voltage multi-dependency stage 110a-d includes a first transistor 116a-d and a second transistor 118a-d. The first transistor 116a-d has a drain coupled to the data storage node 106a-d and a source coupled to the drain of the second transistor 118a-d. The second transistor has a source coupled to the second input stage 104a. The gates of the first and second transistor 116a-d, 118a-d are respectively coupled to two data storage nodes 106a-d that are different from each other and different from the data storage node 106a-d to which the drain of the first transistor 116a-d is coupled.

The gates of the first and second transistors 116a, 118a of the first reference voltage multi-dependency stage 110a are coupled to the second complementary data storage node 106d and the first complementary data storage node 106c, respectively. The gates of the first and second transistors 116b, 118b of the second reference voltage multi-dependency stage 110b are coupled to the first complementary data storage node 106c and the second complementary data storage node 106d, respectively. The gates of the first and second transistors 116c, 118c of the third reference voltage multi-dependency stage 110c are coupled to the second data storage node 106b and the first data storage node 106a, respectively. The gates of the first and second transistors 116d, 118d of the fourth reference voltage multi-dependency stage 110d are coupled to the first data storage node 106a and the second data storage node 106b, respectively.

The first and second data storage nodes 106a, 106b store a duplicate (or the same) data bit (denoted as 'MA' and 'MB', respectively). The first and second complementary data storage nodes 106c, 106d store a complement of the data bit stored in the first and second data storage nodes 106a, 106b (denoted as 'MAn' and 'MBn', respectively). For example, if MA and MB are logical ones, then MAn and MBn are logical zeros, and vice-versa.

The arrangement of the supply and reference voltage multi-dependency stages 108a-d, 110a-d enables data storage node 106a-d dependency in the latch 100a. The dependency ensures that the state of the node 106a-d is changed only if the corresponding states of the nodes on which the node 106a-d depends also change.

For example, the state of the first data storage node 106a (MA') depends on the states of the first and second complementary data storage nodes 106c, 106d ('MAn' and 'MBn'). When the first data storage node 106a stores a logical one, the first and second complementary data storage nodes 106c, 106d both store a logical zero. In order for the state of the first data storage node 106a to change from a logical one to a logical zero, the states of both of the first and second complementary data storage nodes 106c, 106d should change from a logical zero to a logical one. A change in the state of one of the complementary data storage nodes 106c, 106d is not sufficient to cause the state of the first data storage node 106a to change. The added redundancy reduces the likelihood of the changing the data stored in the latch due to radiation or a particle strike, among other events, and adds robustness to the latch 100a in handing such events.

During operation, the first input stage 102a outputs a data bit having a logical one state to two data storage nodes 106a-d for storage, such as the first and second data storage nodes 106a, 106b or the first and second complementary data storage nodes 106c, 106d. The second input stage 104a outputs a data bit having a complementary state (logical zero) to the two data storage nodes 106a-d for storage, such as the first and second data storage nodes 106a, 106b or the first and second complementary data storage nodes 106c, 106d. Thus, for one data bit, the latch stores four bits; two having the same state as the data bit and being duplicates of the data bit, and two having the complementary state or opposite state.

After data is stored or fed into the latch 100a by the first and second input stages 102a, 104a, the state of a data storage node 106a-d does not change unless the states of two other data storage nodes change. For example, initially the first data storage node 106a (MA) stores a logical zero with the first and second complementary data storage nodes 106c, 106d (MAn and MBn) storing the complementary logical one. As a result, the first and second transistor 112a, 114a of the first supply voltage multi-dependency stage 108a are off, and the first data storage node 106a is decoupled from the voltage source node 120. Conversely, the first and second transistor 116a, 118a of the first reference voltage multi-dependency stage 110a are on, and the first data storage node 106a is coupled to the second input stage 104a supplying the reference voltage. Coupling the first data storage node 106a to the second input stage 104a causes the data stored in the first data storage node 106a (MA) to remain at a logical zero.

If one of the first and second complementary data storage nodes 106c, 106d (MAn and MBn) changes states from a logical one to a logical zero (for example, as a result of a soft error), the change is not sufficient to change the state of the first data storage node 106a (MA). If the first complementary data storage node 106c (MAn) changes states from a logical one to a logical zero, the second transistor 114a of the first supply voltage multi-dependency stage 108a turns on. However, because the first transistor 112a remains off, the first supply voltage multi-dependency stage 108a as a whole is off, and the first data storage node 106a (MA) remains decoupled from the voltage source node 120. The change in the state of the first complementary data storage node 106c (MAn) causes the second transistor 118a of the first reference voltage multi-dependency stage 110a to turn off, thereby decoupling the first data storage node 106a (MA) from the second input stage 104a. With the first data storage node 106a (MA) decoupled from both the voltage source node 120 and the second input stage 104a, the first data storage node 106a (MA) retains its logical state of one. The soft error in the state of the first complementary data storage node 106c (MAn) does not affect the stored data of the first data storage node 106a (MA).

Table 1 shows the dependencies of the first and second data storage nodes 106a, 106b (MA, MB) and the first and second complementary data storage nodes 106c, 106d (MAn, MBn).

TABLE 1

| Nodes | Dependency |
|---|---|
| MA | MAn, MBn |
| MB | MAn, MBn |
| MAn | MA, MB |
| MBn | MA, MB |

The stages 108a-d, 110a-d operate to couple a data storage node 106a-d to the voltage source node 120 or the second input stage 104a in the absence of a soft error. When the data storage node 106a-d stores a logical one, it is coupled to the voltage source node 120, and when the data storage node 106a-d stores a logical zero, it is coupled to the second input stage 104a. The stages 108a-d, 110a-d operate to decouple the data storage node 106a-d from both the voltage source node 120 and the second input stage 104a when a soft error occurs. Once decoupled from both the voltage source node 120 and the second input stage 104a, the data storage node 106a-d retains its state from prior to the occurrence of the soft error. If the states of the two nodes on which a data storage node 106a-d depends change, the stages 108a-d, 110a-d operate to change the state of the data storage node 106a-d.

Figure 2:
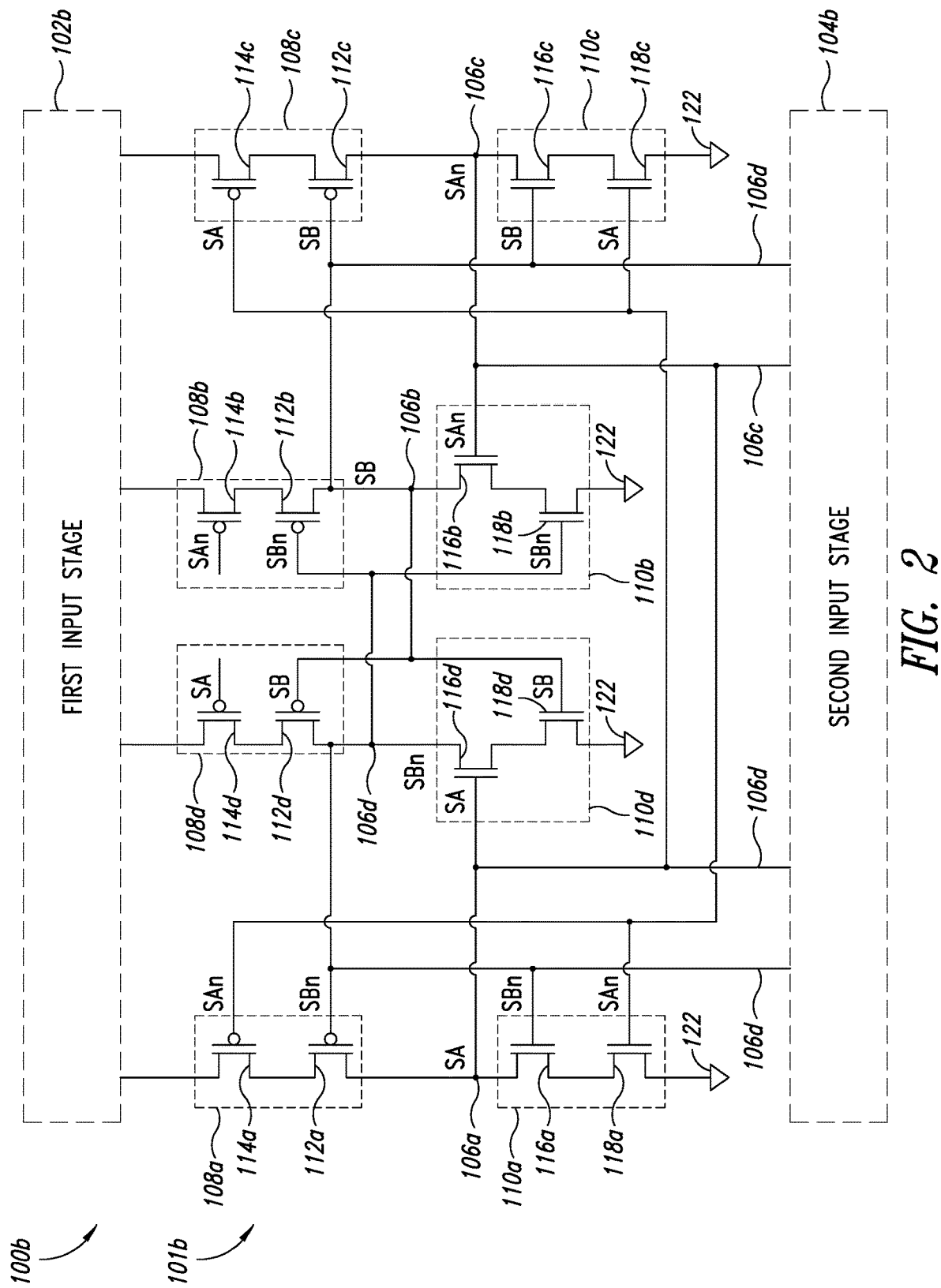
FIG. 2 shows a schematic of a latch.

FIG. 2 shows a schematic of a latch 100b. The latch 100b includes a memory stage 101a and first and second input stages 102b, 104b coupled to the memory stage 101a. The latch 100b has a similar structure as the latch 100a described with reference to FIG. 1. However, in the latch 100b of FIG. 2, the data storage nodes 106a-d are coupled to the second input stage 104b rather than the first input stage 102b. The second input stage 104b operates to selectively couple the first and second data storage nodes 106a, 106b (SA, SB), or the first and second complementary data storage nodes 106c, 106d (SAn, SBn), to a reference voltage node. Thus, the first and second data storage nodes 106a, 106b or the first and second complementary data storage nodes 106c, 106d are set to store a logical zero (or are in the deasserted or deactivated state).

When a data storage node 106a-d stores a logical zero, its complementary nodes 106a-d store a logical one, which results in the associated reference voltage multi-dependency stage 110a-d and the transistors thereof 116a-d, 118a-d being conductive. Thus, the input (source of the second transistor 118a-d) of the reference voltage multi-dependency stages 110a-d is coupled to a reference voltage node 122. The reference voltage node 122 provides a reference voltage or a ground voltage to the latch 100b.

The latch 100b is coupled to the first input stage 102b at the inputs of the supply voltage multi-dependency stages 108a-d. In particular, the sources of the second transistors 114a-d of the supply voltage multi-dependency stages 108a-d are coupled to the first input stage 102b. The first input stage 102b selectively supplies the supply voltage multi-dependency stages 108a-d with a supply voltage.

Figure 3A:
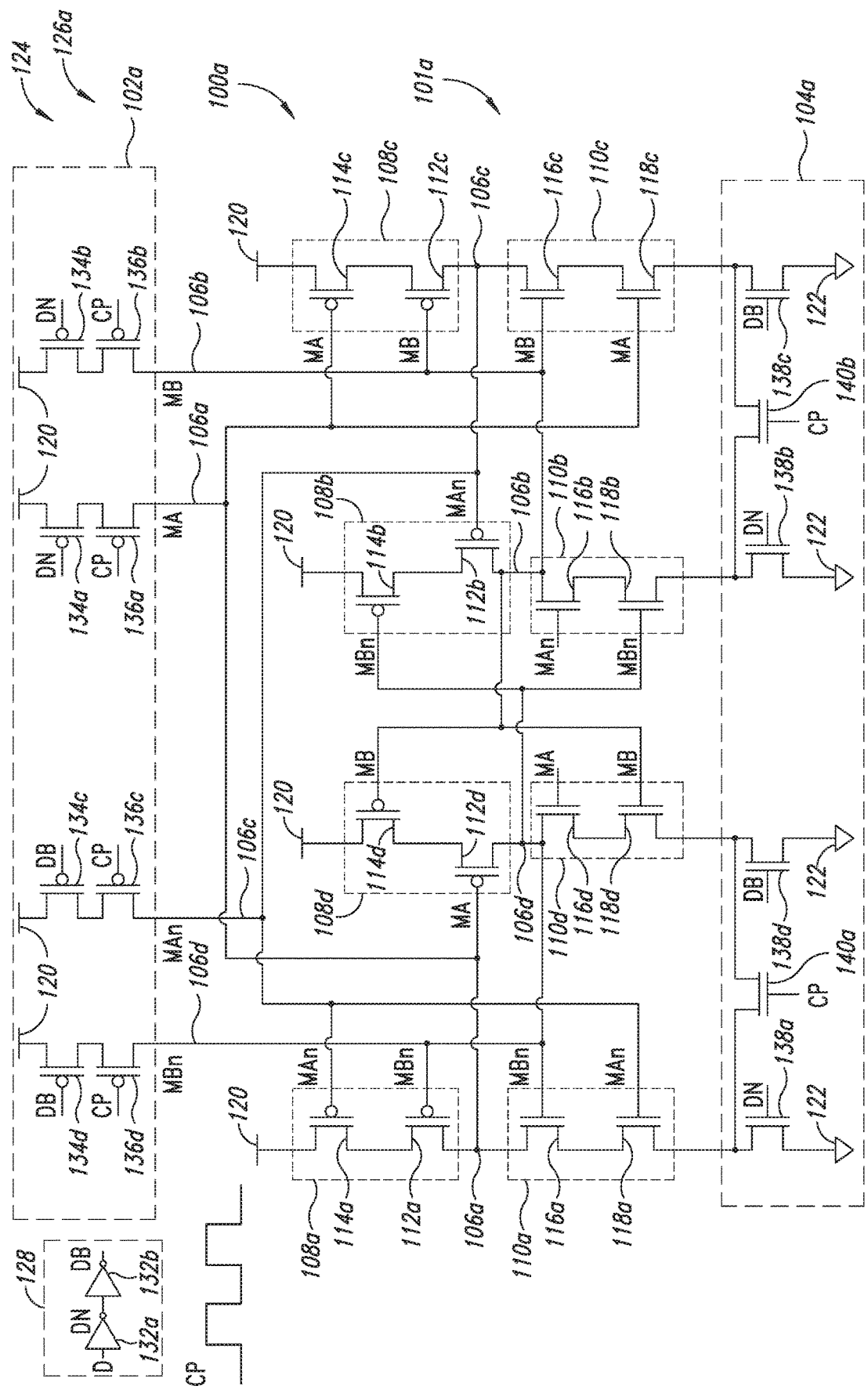
FIGS. 3A and 3B show a schematic of a flip-flop.
Figure 3B:
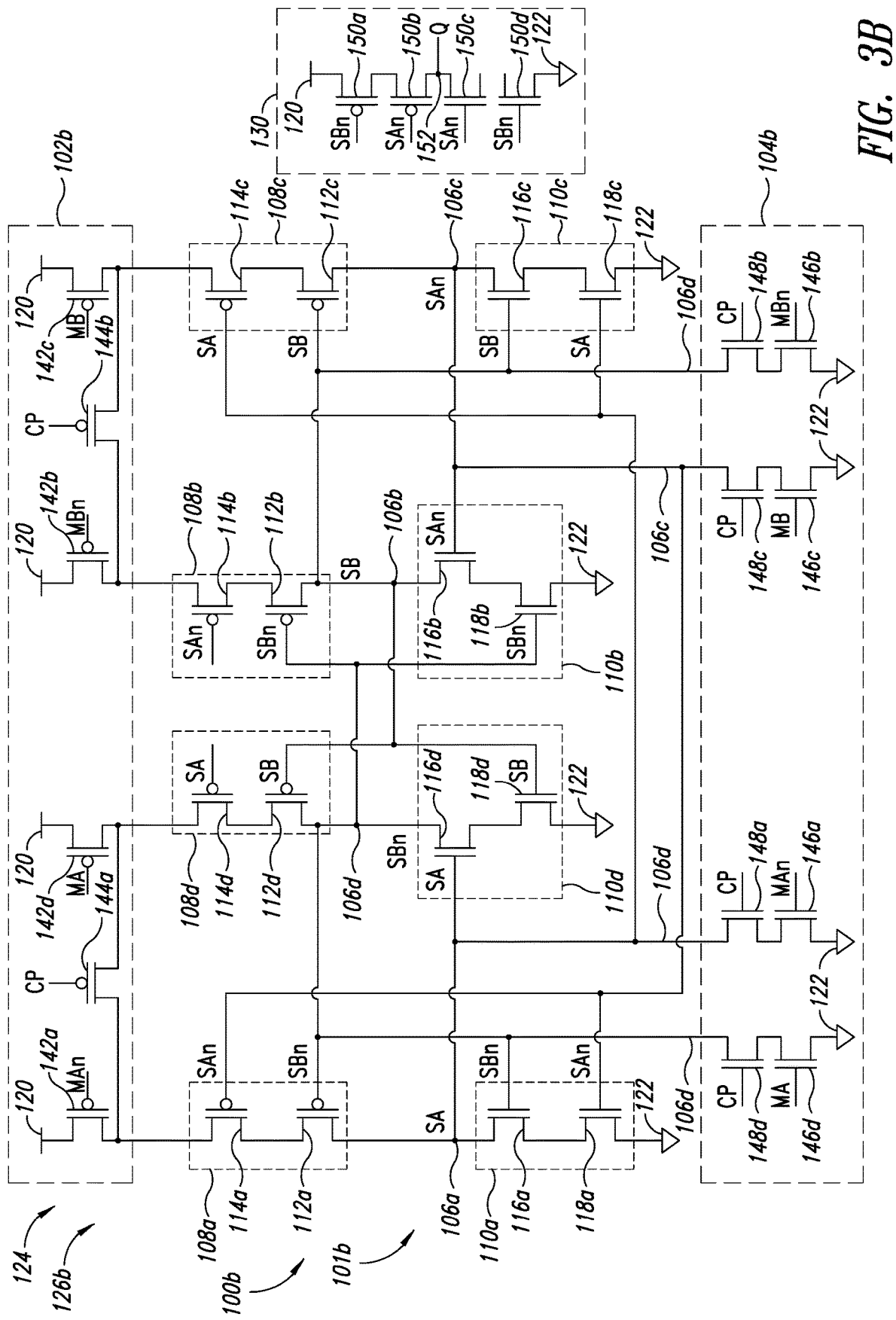

FIGS. 3A and 3B show a schematic of a flip-flop 124. The flip-flop 124 includes a master stage 126a and a slave stage 126b. The master stage 126a includes a data stage 128, the first input stage 102a, a first latch 100a and the second input stage 104a. The slave stage 126b includes the first input stage 102b, a second latch 100b, the second input stage 104b and an output stage 130. The data stage 128 includes two inverting diodes 132a, 132b arranged back-to-back, whereby a cathode of a first inverting diode 132a is coupled to an anode of a second inverting diode 132b. The first inverting diode 132a receives, at its anode, a data bit (denoted D') and outputs, at its cathode, a complement of the data bit (denoted DN'). The second inverting diode 132b receives, at its anode, the complement of the data bit and outputs, at its cathode, the data bit (denoted DB').

The first input stage 102a of the master stage 126a includes first and second data transistors 134a, 134b, first and second complementary data transistors 134c, 134d and first, second, third and fourth clock transistors 136a, 136b, 136c, 136d. The data transistors 134a, 134b, 134c, 134d have a cascaded arrangement with the clock transistors 136a, 136b, 136c, 136d, respectively. Per the cascaded arrangement, the data transistor 134a-d has a source coupled to the voltage source node 120, and a drain coupled to the source of the clock transistor 136a-d. The clock transistor 136a-d has a gate at which a clock signal (denoted CCP') is received. The first and second data transistors 134a, 134b have gates coupled to the cathode of the first inverting diode 132a. The first and second complementary data transistors 134c, 134d have gates coupled to the cathode of the second inverting diode 132b.

The clock transistors 136a, 136b, 136c, 136d have drains that are respectively coupled to the first and second data storage nodes 106a, 106b and the first and second complementary data storage nodes 106c, 106d.

The second input stage 104a includes first and second complementary data transistors 138a, 138b, first and second data transistors 138c, 138d and first and second clock transistors 140a, 140b. The transistors 138a, 138b, 138c, 138d have drains respectively coupled to the sources of the second transistors 118a-d of the reference voltage multi-dependency stages 110a-d, respectively. The transistors 138a, 138b, 138c, 138d have sources that are coupled to the reference voltage node 122. The first and second complementary data transistors 138a, 138b have gates that are coupled to the cathode of the first inverting diode 132a. The first and second data transistors 138c, 138d have gates that are coupled to the cathode of the second inverting diode 132b.

The first clock transistor 140a has a drain coupled to the drain of the first complementary data transistor 138a, a source coupled to the drain of the second data transistor 138d, and a gate at which the clock signal ('CP') is received. The second clock transistor 140b has a drain coupled to the drain of the second complementary data transistor 138b, a source coupled to the drain of the first data transistor 138c, and a gate at which the clock signal ('CP') is received.

In the slave stage 126b of the flip-flop 124, the first input stage 102b includes first, second, third, and fourth master data transistors 142a, 142b, 142c, 142d and first and second clock transistors 144a, 144b. The master data transistors 142a-d have sources that are coupled to the voltage source node 120. The master data transistors 142a, 142b, 142c, 142d have drains that are respectively coupled to the sources of the second transistors 114a, 114b, 114c, 114d of the supply voltage multi-dependency stages 108a, 108b, 108c, 108d. The master data transistors 142a, 142b, 142c, 142d have gates that are respectively coupled to the data storage nodes 106a, 106b, 106c, 106d of the first latch 100a of the master stage 126a.

The first clock transistor 144a has a source coupled to the source of the second transistors 114a of the first supply voltage multi-dependency stages 108a, a drain coupled to the source of the second transistors 114d of the fourth supply voltage multi-dependency stages 108d and a gate for receiving the clock signal (CP). The second clock transistor 144b has a source coupled to the source of the second transistors 114b of the second supply voltage multi-dependency stages 108b, a drain coupled to the source of the second transistors 114c of the third supply voltage multi-dependency stages 108c and a gate for receiving the clock signal (CP).

The second input stage 104b of the slave stage 126b includes first and second data transistors 146a, 146b, first and second complementary data transistors 146c, 146d and first, second, third and fourth clock transistors 148a, 148b, 148c, 148d. The data transistors 146a, 146b, 146c, 146d have a cascaded arrangement with the clock transistors 148a, 148b, 148c, 148d, respectively. Per the cascaded arrangement, the data transistor 146a-d has a source coupled to the reference voltage node 122 and a drain coupled to the source of the clock transistor 148a-d. The clock transistor 148a-d has a gate at which a clock signal (denoted 'CP') is received. The clock transistors 148a, 148b, 148c, 148d have drains that are respectively coupled to the first and second data storage nodes 106a, 106b and the first and second complementary data storage nodes 106c, 106d of the second latch 100b.

The first data transistor 146a has a gate coupled to the first complementary data storage node 106c of the first latch 100a of the master stage 126a, the second data transistor 146b has a gate coupled to the second complementary data storage node 106d of the first latch 100a of the master stage 126a, the first complementary data transistor 146c has a gate coupled to the second data storage node 106b and the second complementary data transistor 146d has a gate coupled to the first data storage node 106a.

The output stage 130 includes first, second, third and fourth transistors 150a, 150b, 150c, 150d that have a cascaded arrangement. The first transistor 150a has a source coupled to the voltage source node 120, a drain coupled to the source of the second transistor 150b and a gate coupled to the second complementary data storage node 106d of the second latch 100b. The second transistor 150b has a drain coupled to an output node 152 and a gate coupled to the first complementary data storage node 106c of the second latch 100b. The third transistor 150c has a drain coupled to the output node 152, a source coupled to the drain of the fourth transistor 150d and a gate coupled to the first complementary data storage node 106c of the second latch 100b. The fourth transistor 150d has a gate coupled to the second complementary data storage node 106d of the second latch 100b and a source coupled to the reference voltage node 122.

The master latch 126a is a single-phase active low latch. When the clock signal (CP) is low, the first and second input stages 102a, 104a feed data into the first latch 100a. When the clock signal (CP) is low, the clock transistors 136a-d of the first input stage 102a are conductive. Thus, depending on whether the data bit (D) is a logical zero or one, either the first and second data storage nodes 106a, 106b or the first and second complementary data storage nodes 106c, 106d are coupled to the voltage source node 120 to store a logical one.

When the data bit (D) is a logical one, the first and second data transistors 134a, 134b are conductive and a logical one is passed to the first and second data storage nodes 106a, 106b (MA and MB). As described herein, the first and second complementary data storage nodes 106c, 106d (MAn and MBn) are dependent on the first and second data storage nodes 106a, 106b (MA and MB).

Concurrently, the first and second data transistors 138c, 138d of the second input stage 104a are conductive and the first and second complementary data transistors 138a, 138b are non-conductive. Thus, the reference voltage of the reference voltage node 122 is passed to the sources of the second transistors 118c, 118d and, via the third and fourth reference voltage multi-dependency stages 110c, 110d, to the first and second complementary data storage nodes 106c, 106d (MAn and MBn), which consequently transition to store a logical zero. When the data bit (D) is a logical zero, the first and second input stage 102a, 104a operate in a similar manner to cause a logical zero to be stored in the first and second data storage nodes 106a, 106b (MA and MB) and a logical one to be stored in the first and second complementary data storage nodes 106c, 106d (MAn and MBn).

When the clock signal (CP) transitions to a logical zero, the first input stage 102a is off. The second input stage 104a supplies a reference voltage at the sources of the second transistors 118a-d of the reference voltage multi-dependency stages 110a-d. The first latch 100a retains the stored data in the data storage nodes 106a-d.

In the slave latch 126b, the second input stage 104b is off while the clock signal (CP) is low. The first input stage 102b provides a supply voltage to the sources of the second transistors 114a-d of the supply voltage multi-dependency stages 108a-d. The second latch 102b retains the previously stored data in the data storage nodes 106a-d.

When the clock signal (CP) transitions to high, the clock transistors 148a-d become conductive. Either the first and second data transistors 146a, 146b or the first and second complementary data transistors 146c, 146d are conductive depending on the logical state of the data stored in the first and second data storage nodes 106a, 106b (MA and MB) and the first and second complementary data storage nodes 106c, 106d (MAn and MBn) of the first latch 100a of the master latch 126a.

When the master latch 126a stores a logical one in the first and second data storage nodes 106a, 106b (MA and MB), the second input stage 104b passes a logical zero to the first and second complementary data storage nodes 106c, 106d (SAn and SBn) of the slave latch 126b. As described herein, the first and second data storage nodes 106a, 106b (SA and SB) are dependent on the first and second complementary data storage nodes 106c, 106d (SAn and SBn). Thus, a logical one is fed from the first input stage 102b to the first and second data storage nodes 106a, 106b (SA and SB).

Thus, when the clock signal (CP) becomes high, the data stored in the data storage nodes 106a-d of the master latch 126a are passed to the data storage nodes 106a of the slave latch 126b. The slave latch 126b, which is an active-high latch, stores the data stored in the master latch 126a at the moment when the clock signal (CP) transitions from low to high. When the clock signal (CP) transitions back to low, the slave latch 126b retains the data it had stored when the clock signal (CP) was high.

The output stage 130 outputs either a logical one or a logical zero based on the state of the data stored in the first and second complementary data storage nodes 106c, 106d (SAn and SBn). When both complementary data storage nodes 106c, 106d (SAn and SBn) are a logical zero, the output stage 130 outputs a logical one at the output node 152. Conversely, when both complementary data storage nodes 106c, 106d (SAn and SBn) are a logical one, the output stage 130 outputs a logical zero at the output node 152. If the first and second complementary data storage nodes 106c, 106d (SAn and SBn) have different states, the output stage 130 retains the previous output (i.e., the output provided prior to the disagreement between the states of the data in the first and second complementary data storage nodes 106c, 106d (SAn and SBn)).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
   a first latch including:
      a plurality of storage nodes including:
         a plurality of data storage nodes each configured to store a data bit having one of two states including a first state and a second state; and
         a plurality of complementary data storage nodes each configured to store a complement of the data bit;
      a plurality of first voltage multi-dependency stages respectively corresponding to the plurality of storage nodes, each first voltage multi-dependency stage having an output coupled to a respective storage node of the plurality of storage nodes and at least two control inputs respectively coupled to at least two other storage nodes of the plurality of storage nodes, the first voltage multi-dependency stage configured to cause the state of the data bit stored in the storage node to change from the second state to the first state in response to a change in both states of two data bits respectively stored in the at least two other storage nodes; and
      a plurality of second voltage multi-dependency stages respectively corresponding to the plurality of storage nodes, each second voltage multi-dependency stage having an output coupled to the respective storage node of the plurality of storage nodes and at least two control inputs respectively coupled to the at least two other storage nodes of the plurality of storage nodes, the second voltage multi-dependency stage configured to cause the state of the data bit stored in the storage node to change from the first state to the second state in response to a change in both states of two data bits respectively stored in the at least two other storage nodes.

2. The circuit of claim 1, wherein the second voltage multi-dependency stage comprises:
   a first transistor having a first conduction terminal coupled to the storage node, a control terminal coupled to a first storage node of the at least two other storage nodes and a second conduction terminal; and
   a second transistor having a first conduction terminal coupled to the second conduction terminal of the first transistor, a second conduction terminal coupled to a second voltage node that supplies a second voltage and a control terminal coupled to a second storage node of the at least two other storage nodes.

3. The circuit of claim 1, wherein the first voltage multi-dependency stage is configured to refrain from causing the state of the data bit stored in the storage node to change from the second state to the first state when only one of the two data bits respectively stored in the at least two other storage nodes changes states or when neither one of the two data bits respectively stored in the at least two other storage nodes changes states.

4. The circuit of claim 1, wherein the first voltage multi-dependency stage comprises:
   a first transistor having a first conduction terminal coupled to the storage node, a control terminal coupled to a first storage node of the at least two other storage nodes and a second conduction terminal; and
   a second transistor having a first conduction terminal coupled to the second conduction terminal of the first transistor, a second conduction terminal coupled to a first voltage node that supplies a first voltage and a control terminal coupled to a second storage node of the at least two other storage nodes.

5. The circuit of claim 1, wherein the first latch includes:
   a first input stage coupled to the plurality of storage nodes and configured to:
      receive a clock signal having one of two clock states including a first clock state and a second clock state;
      receive a data signal having a data signal state;
      in response to the clock signal having the first clock state, set the data bit and the complement of the data bit based on the data signal state; and
      in response to the clock signal having the second clock state, refrain from setting the data bit and the complement of the data bit.

6. The circuit of claim 5, comprising:
   a second latch coupled to the first latch and including a plurality of second latch storage nodes, the second latch being configured to:
      receive the clock signal; and
      in response to the clock signal having the second clock state, cause data stored in the plurality of storage nodes to be transferred to the plurality of second latch storage nodes, respectively.

7. A method, comprising:
   storing a plurality of data bits in a respective plurality of storage nodes of a latch, each data bit of the plurality of data bits being stored in a respective storage node of the plurality of storage nodes;
   determining, by a first multi-dependency stage having an output coupled to the storage node of the plurality of storage nodes and two inputs respectively coupled to at least two other storage nodes of the plurality of storage nodes, whether two respective states of two data bits stored in the at least two other storage nodes, respectively, changed;

in response to determining that the two respective states changed, causing a state of a data bit stored in the storage node to change, wherein causing the state of the data bit stored in the storage node to change includes causing the state of the data bit to change from a first state to a second state, and wherein each data bit of the plurality of data bits has one of two states including the first state corresponding to a reference voltage and a second state corresponding to a supply voltage;

in response to determining that one of the two respective states or none of the two respective states changed, refraining from causing the state of the data bit stored in the storage node to change;

determining, by a second multi-dependency stage having an output coupled to the storage node of the plurality of storage nodes and two inputs respectively coupled to the at least two other storage nodes of the plurality of storage nodes, whether the two respective states of the two data bits stored in the at least two other storage nodes, respectively, changed from the first state to the second state; and in response to determining that the two respective states changed from the first state to the second state, causing the state of the data bit stored in the storage node to change from the second state to the first state.

8. The method of claim 7, wherein the first multi-dependency stage includes:

a first transistor having a first conduction terminal coupled to the storage node, a control terminal coupled to a first storage node of the at least two other storage nodes and a second conduction terminal; and a second transistor having a first conduction terminal coupled to the second conduction terminal of the first transistor, a second conduction terminal coupled to a supply voltage node that supplies the supply voltage and a control terminal coupled to a second storage node of the at least two other storage nodes.

9. The method of claim 8, wherein the second multi-dependency stage includes:

a first transistor having a first conduction terminal coupled to the storage node, a control terminal coupled to the first storage node of the at least two other storage nodes and a second conduction terminal; and a second transistor having a first conduction terminal coupled to the second conduction terminal of the first transistor, a second conduction terminal coupled to a supply voltage node that supplies the supply voltage and a control terminal coupled to the second storage node of the at least two other storage nodes.

10. A latch, comprising:

a supply voltage node;

a reference voltage node;

a plurality of storage nodes including a first, second and third storage nodes; and a plurality of supply voltage multi-dependency stages including a first supply voltage multi-dependency stage, the first supply voltage multi-dependency stage including a first supply transistor and a second supply transistor, the first supply transistor having a first conduction terminal coupled to the first storage node, a control terminal coupled to the second storage node and a second conduction terminal, the second supply transistor having a first conduction terminal coupled to the second conduction terminal of the first supply transistor, a control terminal coupled to the third storage node and a second conduction terminal coupled to the supply voltage node; and a plurality of reference voltage multi-dependency stages including a first reference voltage multi-dependency stage, the first reference voltage multi-dependency stage including a first reference transistor and a second reference transistor, the first reference transistor having a first conduction terminal coupled to the first storage node, a control terminal coupled to the second storage node and a second conduction terminal, the second reference transistor having a first conduction terminal coupled to the second conduction terminal of the first reference transistor, a control terminal coupled to the third storage node and a second conduction terminal coupled to the reference voltage node.

11. The latch of claim 10, wherein the plurality of storage nodes include a fourth storage node.

12. The latch of claim 11, wherein the first and fourth storage nodes are configured to store a data bit and the second and third storage nodes are configured to store a complement of the data bit.

13. The latch of claim 11, comprising:

a first input stage configured to selectively couple the first and fourth storage nodes or the second and third storage nodes to the supply voltage node.

14. The latch of claim 13, wherein the first input stage is configured to:

receive a clock signal and an input data signal;

couple the first and fourth storage nodes to the supply voltage node when the clock signal has a low state and the input data signal has a high state; and couple the first and fourth storage nodes to the reference voltage node when the clock signal has the low state and the input data signal has a low state.

15. The latch of claim 14, wherein the first input stage is configured to:

decouple the first and fourth storage nodes from the supply voltage node when the clock signal transitions to the high state.

16. The latch of claim 11, comprising:

a second input stage configured to selectively couple the first and fourth storage nodes or the second and third storage nodes to the reference voltage node.

17. A circuit, comprising:

a first latch including:

a plurality of storage nodes including:

a plurality of data storage nodes each configured to store a data bit having one of two states including a first state and a second state; and a plurality of complementary data storage nodes each configured to store a complement of the data bit; and a plurality of first voltage multi-dependency stages respectively corresponding to the plurality of storage nodes, each first voltage multi-dependency stage having an output coupled to a respective storage node of the plurality of storage nodes and at least two control inputs respectively coupled to at least two other storage nodes of the plurality of storage nodes, the first voltage multi-dependency stage configured to cause the state of the data bit stored in the storage node to change from the second state to the first state in response to a change in both states of two data bits respectively stored in the at least two other storage nodes, wherein the first voltage multi-dependency stage includes:

a first transistor having a first conduction terminal coupled to the storage node, a control terminal coupled to a first storage node of the at least two other storage nodes and a second conduction terminal; and a second transistor having a first conduction terminal coupled to the second conduction terminal of the first transistor, a second conduction terminal coupled to a first voltage node that supplies a first voltage and a control terminal coupled to a second storage node of the at least two other storage nodes.

18. The circuit of claim 17, wherein the first voltage multi-dependency stage is configured to refrain from causing the state of the data bit stored in the storage node to change from the second state to the first state when only one of the two data bits respectively stored in the at least two other storage nodes changes states or when neither one of the two data bits respectively stored in the at least two other storage nodes changes states.

19. The circuit of claim 17, wherein the first latch includes:
a first input stage coupled to the plurality of storage nodes and configured to:
receive a clock signal having one of two clock states including a first clock state and a second clock state;
receive a data signal having a data signal state;
in response to the clock signal having the first clock state, set the data bit and the complement of the data bit based on the data signal state; and
in response to the clock signal having the second clock state, refrain from setting the data bit and the complement of the data bit.

20. A circuit, comprising:
a first latch including:
a plurality of storage nodes including:
a plurality of data storage nodes each configured to store a data bit having one of two states including a first state and a second state; and
a plurality of complementary data storage nodes each configured to store a complement of the data bit;
a plurality of first voltage multi-dependency stages respectively corresponding to the plurality of storage nodes, each first voltage multi-dependency stage having an output coupled to a respective storage node of the plurality of storage nodes and at least two control inputs respectively coupled to at least two other storage nodes of the plurality of storage nodes, the first voltage multi-dependency stage configured to cause the state of the data bit stored in the storage node to change from the second state to the first state in response to a change in both states of two data bits respectively stored in the at least two other storage nodes; and
a first input stage coupled to the plurality of storage nodes and configured to:
receive a clock signal having one of two clock states including a first clock state and a second clock state;
receive a data signal having a data signal state;
in response to the clock signal having the first clock state, set the data bit and the complement of the data bit based on the data signal state; and
in response to the clock signal having the second clock state, refrain from setting the data bit and the complement of the data bit.

21. The circuit of claim 20, wherein the first voltage multi-dependency stage is configured to refrain from causing the state of the data bit stored in the storage node to change from the second state to the first state when only one of the two data bits respectively stored in the at least two other storage nodes changes states or when neither one of the two data bits respectively stored in the at least two other storage nodes changes states.

22. The circuit of claim 20, comprising:
a second latch coupled to the first latch and including a plurality of second latch storage nodes, the second latch being configured to:
receive the clock signal; and
in response to the clock signal having the second clock state, cause data stored in the plurality of storage nodes to be transferred to the plurality of second latch storage nodes, respectively.

23. A method, comprising:
storing a plurality of data bits in a respective plurality of storage nodes of a latch, each data bit of the plurality of data bits being stored in a respective storage node of the plurality of storage nodes;
determining, by a first multi-dependency stage having an output coupled to the storage node of the plurality of storage nodes and two inputs respectively coupled to at least two other storage nodes of the plurality of storage nodes, whether two respective states of two data bits stored in the at least two other storage nodes, respectively, changed;
in response to determining that the two respective states changed, causing a state of a data bit stored in the storage node to change, wherein causing the state of the data bit stored in the storage node to change includes causing the state of the data bit to change from a first state to a second state, and wherein each data bit of the plurality of data bits has one of two states including the first state corresponding to a reference voltage and the second state corresponding to a supply voltage; and
in response to determining that one of the two respective states or none of the two respective states changed, refraining from causing the state of the data bit stored in the storage node to change, wherein the first multi-dependency stage includes:
a first transistor having a first conduction terminal coupled to the storage node, a control terminal coupled to a first storage node of the at least two other storage nodes and a second conduction terminal; and
a second transistor having a first conduction terminal coupled to the second conduction terminal of the first transistor, a second conduction terminal coupled to a supply voltage node that supplies the supply voltage and a control terminal coupled to a second storage node of the at least two other storage nodes.

24. The method of claim 23, wherein the latch includes a second multi-dependency stage including:
a first transistor having a first conduction terminal coupled to the storage node, a control terminal coupled to the first storage node of the at least two other storage nodes and a second conduction terminal; and
a second transistor having a first conduction terminal coupled to the second conduction terminal of the first transistor, a second conduction terminal coupled to a supply voltage node that supplies the supply voltage and a control terminal coupled to the second storage node of the at least two other storage nodes.

* * * * *